(12) United States Patent
Khandekar et al.

(10) Patent No.: US 7,190,078 B2
(45) Date of Patent: Mar. 13, 2007

(54) INTERLOCKING VIA FOR PACKAGE VIA INTEGRITY

(76) Inventors: Viren V. Khandekar, 799 W. Carob Way, Chandler, AZ (US) 85248; Jesus L. Munoz, Block 72, Lot 30, Metrosouth Subdivision Manggahan, General Trias Cavite 4107 (PH); Lilia Benigra-Unite, B58 L34 Chateau Real Homes Manggahan, General Trias Cavite 4107 (PH); Mario M. Tobias, #12 James Street Filinvest East, Antipolo 1870 (PH)

( * ) Notice: Subject to any disclaimer, the term of this patent is extended or adjusted under 35 U.S.C. 154(b) by 0 days.

(21) Appl. No.: 11/023,750

(22) Filed: Dec. 27, 2004

(65) Prior Publication Data
US 2006/0141762 A1    Jun. 29, 2006

(51) Int. Cl.
*H01L 23/48* (2006.01)
(52) U.S. Cl. .............. 257/774; 257/621; 257/E23.142; 438/622; 438/E23.145
(58) Field of Classification Search ........ 257/621–623, 257/508, 700, 774; 438/622, 629, 637–640, 438/672–675, 687, 618, 666
See application file for complete search history.

(56) References Cited

U.S. PATENT DOCUMENTS

| 6,800,549 | B2 * | 10/2004 | Lee | 438/628 |
| 2003/0194872 | A1 * | 10/2003 | Parikh et al. | 438/694 |
| 2005/0277281 | A1 * | 12/2005 | Dubin et al. | 438/618 |

* cited by examiner

*Primary Examiner*—Quoc Hoang
(74) *Attorney, Agent, or Firm*—Laleh Jalali

(57) ABSTRACT

A method of forming an interconnection structure in a microelectronic package, and an interconnection structure of a microelectronic package formed according to the method. The method includes: providing a combination including a first conductive layer and a dielectric layer fixed to the conductive layer; providing a hole through the dielectric layer extending from a surface of the dielectric layer to the first conductive layer; providing a recess in the first conductive layer and in communication with the hole to provide an interlocking volume under the dielectric layer; providing a conductive material in the hole and in the recess to form a package via having an interlocking section in the interlocking volume of the recess; and providing a conductive material on the dielectric layer to form a second conductive layer adapted to be in electrical contact with the first conductive layer through the package via.

11 Claims, 11 Drawing Sheets

INTERLOCKING VIA FOR PACKAGE VIA INTEGRITY

FIELD

Embodiments of the present invention relate to vias, and in particular to the use of a via interconnect structure and its method of fabrication.

BACKGROUND

As the size of semiconductor devices decreases, the density of semiconductor devices increases, and the interconnect density within substrates and printed circuit board ("PCB") increases. To provide such increased interconnections, the interconnect dimensions and spacing decrease, and the number of interconnect layers increase. Multiple interconnect layers may be fabricated so that conductive layers are separated by dielectric layers. A via in a semiconductor substrate or PCB provides an electrical connection between conductors on different layers of the substrate or PCB. For example, a via may provide an electrical connection from the surface of the substrate or PCB to a conductive trace within the substrate or PCB.

Via technology has proven to pose major challenges to package reliability. One of the most prevalent issues surrounding via formation is via delamination, a defect commonly characterized by the separation of the via from the underlying metal. Via delamination typically manifests itself as opens or as high resistance failures during electrical continuity testing. In particular, package microvia integrity is a critical concern during process ramps and for high process manufacturing purposes. Via delamination is currently a significant reliability issue affecting downstream users. Delamination may result in "NO BOOT" fails at the test process level, currently manifesting at greater than ten thousand defects per million, delaying production and driving up costs.

According to the current state of the art, as seen for example in FIG. 1A, a package substrate 100 includes a core 110, such as, for example, a silicon core, conductive layers 120, 120', 120" and 120''', and a dielectric material 130 separating the conductive layers. A plated through hole 112 includes supporting core 113 therein, made, for example, of an epoxy resin, the supporting core being plated with a conductive material 114, such as, for example, copper. The conductive layers 120, 120', 120" and 120''' may further comprise copper. As further seen in FIG. 1, the shown configuration includes conductive layers 120 and 120''' which each include an electrolessly plated first layer 125, such as a player of elecrolessly plated copper, and an electrolytically plated second layer 126 such as an electrolytically plated copper. The dielectric material 130 insulates the conductive layers from each other. Via 140 provides electrical connections between conductive layers 120 and 120' separated by dielectric material 130. The via is meant to extend through the dielectric material 130 to allow electrical contact between different conductive layers 120. As seen in FIG. 1, the provision of vias on a package level typically involves top and bottom processing, as seen for example by the presence of vias 140 and 140'. Various factors, such as, for example, thermal expansion of the dielectric material 130, can produce a vertical tensile stresses on vias, such as via 140, which can cause the bottom of the via to detach from bottom conductive layer 120', creating a delamination void. The existence of a delamination void means that via 140 cannot effectively provide an electrical connection between conductive layer 120 and 120'.

Referring next to FIG. 2A, an optical image of a staggered via is provided. FIG. 2B shows a detail of FIG. 2B depicting a failing via, the delamination at 150 being visible at the bottom of the via.

The problem of via delamination is exacerbated in the case of a via-on-via, or stacked via configuration, as seen for example in FIG. 3. A series 1000 of stacked vias 1400 and 1410 are shown with the bottom via 1410 as having failed through delamination at 1500. Stacked via configurations typically result in higher rates of delamination by virtue of the higher stresses inherent in the package structural design. Typically, the risk of incurring defects in stacked via configurations is mitigated by the use of improved dielectric materials that are less prone to thermal expansion or by lessening the number of vias that are stacked above one another. However, future technologies will tend to rely further on larger numbers of stacked vias as well as on smaller via dimensions.

The state of the art currently attempts to address the problem of via delamination in general in a number of ways, such as, for example, through optimization of the substrate manufacturing process and through implementation of tighter process controls; through the use of dielectric materials less prone to tensile stresses as a result of temperature shifts; through the creation of redundant vias, particularly in areas that are prone to failure such as areas of high mechanical stress; and through an increase the size of vias. In addition, a number of added process steps are typically implemented in order to monitor defects caused by via delamination. For example, a process referred to as "Temp Shock 'C'" monitoring may be implemented in order to monitor via delamination by subjecting units to be tested to large temperature gradients in order to accelerate failure. Additionally, in a process referred to as "R-shift nets" coverage, a continuity test from device pin to bumps, provides for the testing of pre-selected vias by measuring their resistance. To control problems associated with via delamination, the state of the art increases R-shift nets processing by increasing the number of vias tested in order to monitor unit failures.

Interlocking via formation has been used on the wafer level in prior generation silicon processes with a conventional backend interconnect scheme (that is, on a single side of the wafer) in order to improve robustness against via delamination. On the wafer level, vias were formed with an anchor like structure at their bottom regions which held the vias under the wafer insulator. U.S. Pat. No. 5,619,071 relates to the provision of interlocking vias at the wafer level.

The state of the art fails to provide a reliable method of containing via delamination for improving package via integrity.

BRIEF DESCRIPTION OF THE DRAWINGS

Embodiments of the invention are illustrated by way of example and not by way of limitation in the figures of the accompanying drawings, in which the like references indicate similar elements and in which:

FIGS. 11A–11L are cross sectional views depicting stages in the formation of the package interconnection structure of FIG. 10.

DETAILED DESCRIPTION

A method of forming an interconnection structure in a microelectronic package, an interconnection structure of a microelectronic package formed according to the method, and a system including the interconnection structure are described herein.

Various aspects of the illustrative embodiments will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative embodiments. However, it will be apparent to one skilled in the art that the present invention may be practiced without the specific details. In other instances, well-known features are omitted or simplified in order not to obscure the illustrative embodiments.

Various operations will be described as multiple discrete operations, in turn, in a manner that is most helpful in understanding embodiments of the present invention. However, the order of description should not be construed as to imply that these operations are necessarily order dependent. In particular, these operations need not be performed in the order of presentation.

The word "embodiment" is used repeatedly. The word generally does not refer to the same embodiment, however, it may. The terms "comprising", "having" and "including" are synonymous, unless the context dictates otherwise.

Figure 1:
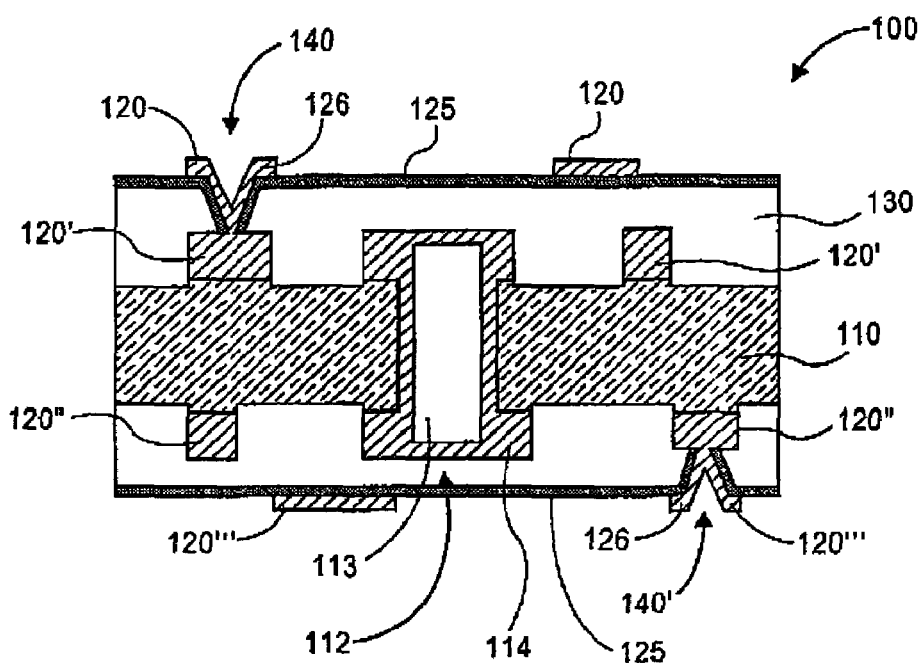
FIG. 1 is a cross sectional depiction of a prior art package interconnection structure including vias.
Figure 3:
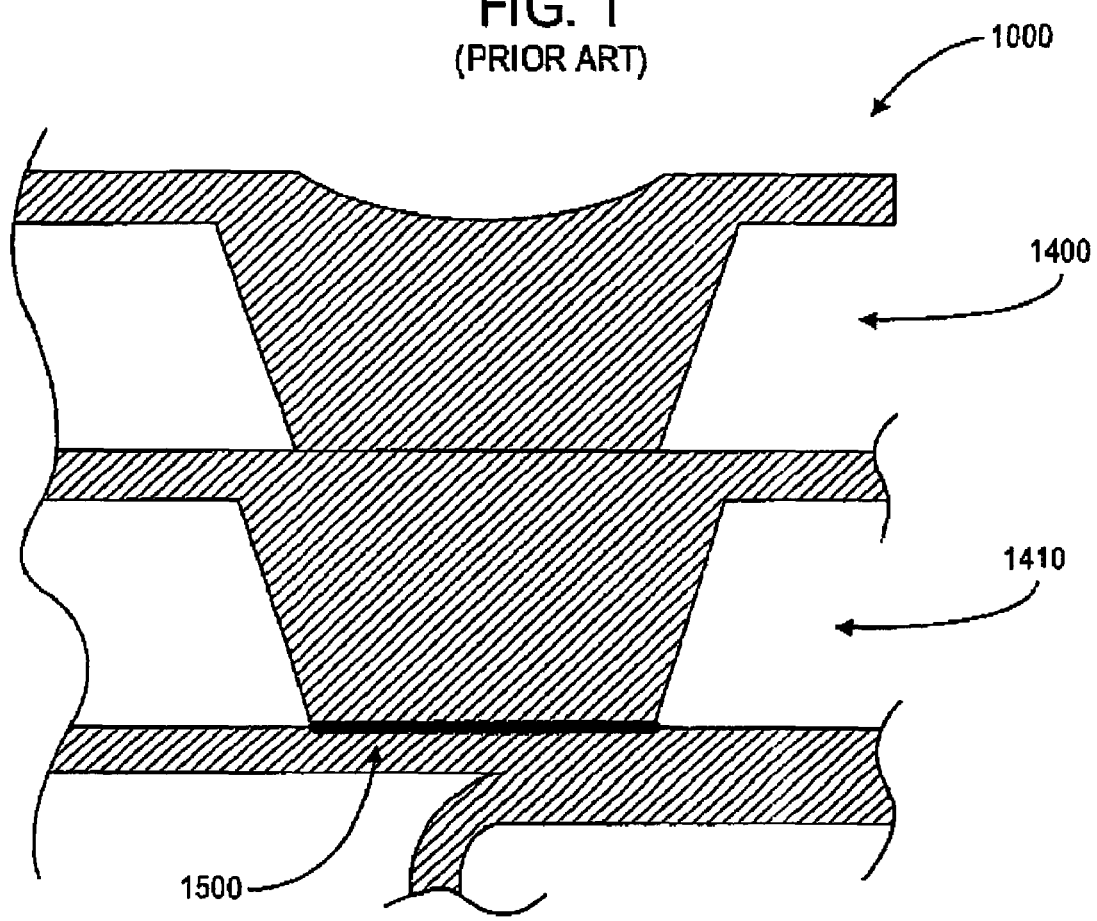
FIG. 3 is a cross sectional depiction of a prior art package interconnection structure including stacked vias.
Figure 2A:
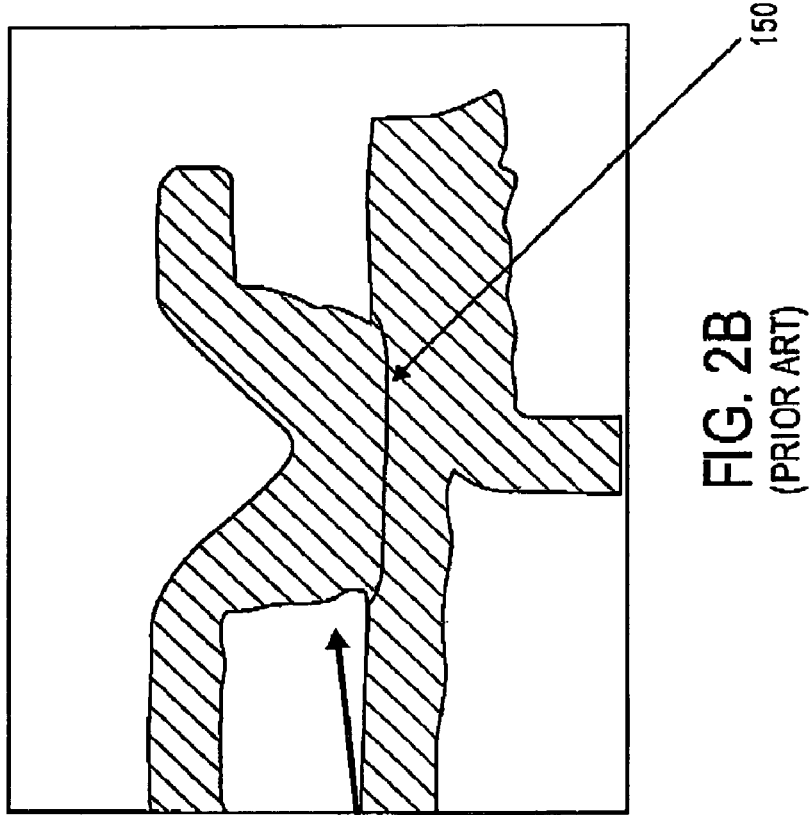
FIG. 2A is a is a cross sectional depiction of a prior art package interconnection structure including staggered vias.
Figure 2B:
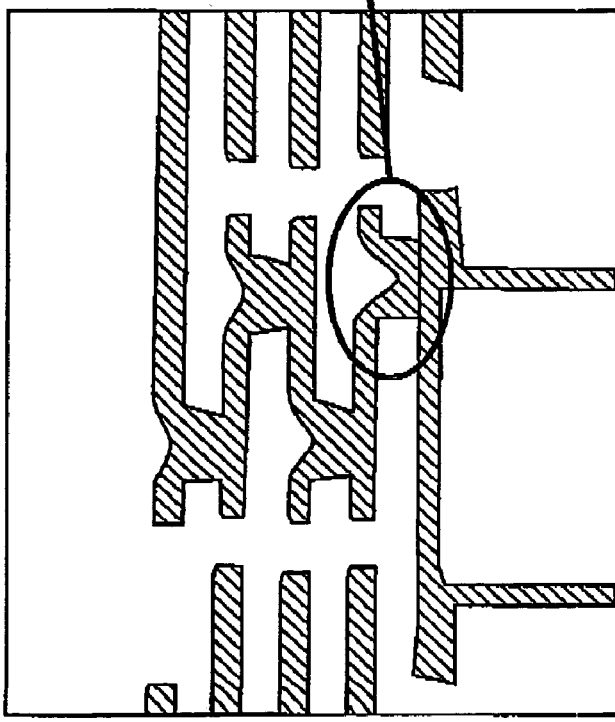
FIG. 2B is a view of a detail of FIG. 2A, showing a bottom portion of a via of FIG. 2A as having delaminated.
Figure 4A:
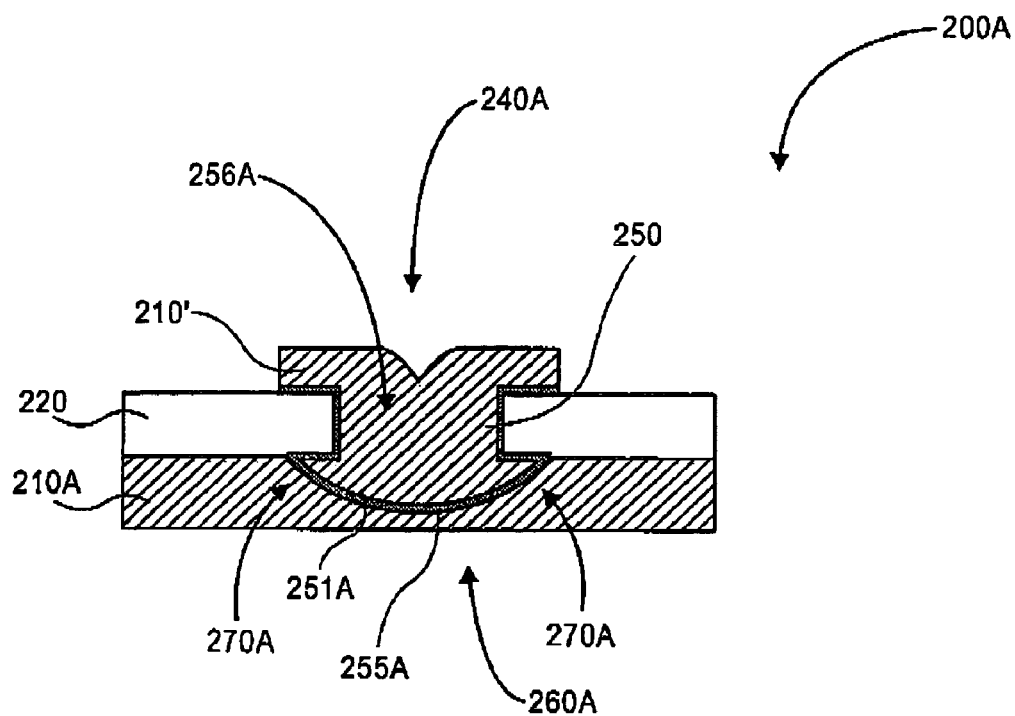
FIG. 4A is a cross sectional view of a package interconnection structure according to a first embodiment.
Figure 4B:
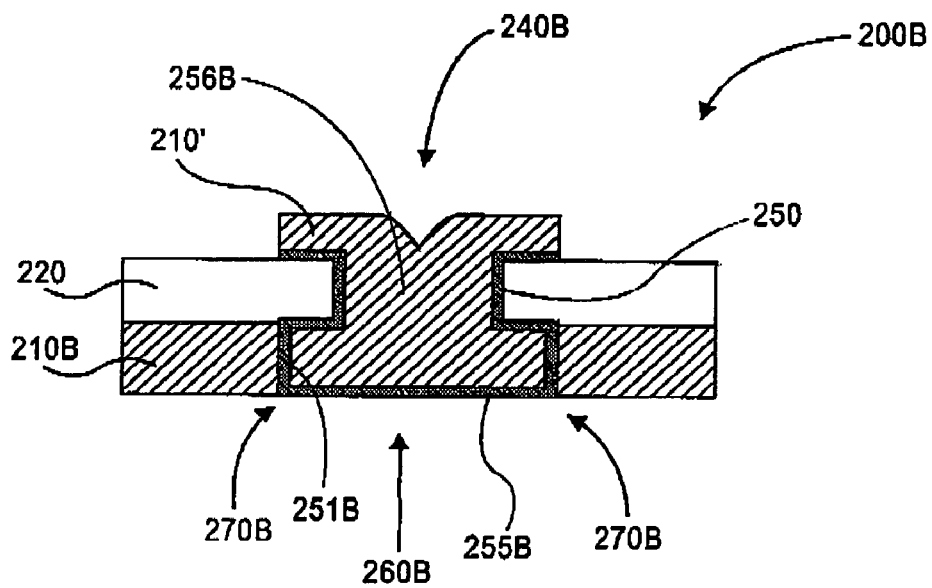
FIG. 4B is a view similar to FIG. 4A showing a second embodiment.

Cross-sectional views of preferred embodiments of novel interconnection structures according to the present invention are illustrated in FIGS. 4A and 4B, which show two possible embodiments of the present invention. A difference between FIG. 4A and FIG. 4B is that the interconnection structure of FIG. 4A has an anchor-shaped interlocking section, while the interconnection structure of FIG. 4B has a T-shaped interlocking section, as will be described in further detail below. The interconnection structures 200A and 200B as shown in FIGS. 4A and 4B represent novel configurations for package vias such as those shown by way of example in the arrangement of FIG. 1. In the instant description reference to elements in the alternative, such as, for example, reference to "interlocking section 260A/260B," refers to either interlocking section 260A or to interlocking section 260B depending on the embodiment being considered.

As seen in FIGS. 4A and 4B, each of the interconnection structures 200A and 200B include a first or bottom conductive layer 210 made, for example, of copper. Conductive layer 210 may be a conductive trace, a conductive plane, or another conductor. Above conductive layer 210 is a dielectric layer 220, which may comprise a resin composite material, such as glass fibers in a hydrocarbon/ceramic matrix, glass fibers in a thermoset polyester matrix, a resin material, such as an epoxy, an epoxy-acrylate mixed resin, or other materials. A second or top conductive layer 210' may cover at least part of dielectric layer 220, and may, similar to layer 210, be made of copper. A via 240A/240B may extend from top conductive layer 210' to bottom conductive layer 210 through the dielectric layer 220 by way of a via hole 250 through the dielectric layer 220. Below the bottom surface of dielectric layer 220, via 240A/240B has an interlocking section 260A/260B. Interlocking section 260A/260B is wider than via hole 250 so that there is a corresponding overlap or undercut section 270A/270B beyond the side walls of the dielectric layer 220 as shown. Hole 250 in dielectric layer 220, together with a recess 251A/251B provided in conductive layer 210 to house the interlocking sections 260A/260B, collectively allow the formation of an interlocking via such as via 240 by filling the hole 250 and recess 251A/251B with conductive material as shown. The conductive material may include a first electrolessly plated layer 255A/255B and a bulk electrolytically plated layer 256A/256B plated above layer 255A/255B as shown. Layers 255A/255B and 256A/256B may, in one embodiment, include copper. On one embodiment, the width of the interlocking section 260A/260B, which includes the width of overlap or undercut section 270A/270B as well as the width of via hole 250, may range from about 50 microns to about 80 microns. Interlocking section 260A/260B, with its overlap or undercut section 270A/270B, acts as a physical interlock, to prevent vertical tensile stresses from detaching via 240A/240B from bottom conductive layer 210.

In one embodiment, the interlocking section forms the shape of an anchor when viewed in cross-section, such as interlocking section 260A in FIG. 4A. In another embodiment, the interlocking section forms a T-shape when viewed in cross-section, such as interlocking section 260B in FIG. 4B. It is to be understood, however, that embodiments of the present invention encompass other cross-sectional shapes for the interlocking section, as would be within the knowledge of one skilled in the art.

According to embodiments of the present invention, interlocking sections provided on the vias, such as interlocking sections 260A/260B, lock via connections securely in place. By way of example, undercutting dielectric layer 220 by between about 3 to about 7 microns provides sufficient anchoring of via 240A/240B while allowing high density placement of vias across a package. It is to be appreciated that with the novel via profile of embodiments of the present invention, vias, such as, for example, via 240A or via 240B, have a large interfacial contact area with bottom conductive layer 210, with the vertical sides of via hole 250, and with the underside of dielectric layer 220. The above improves both performance and reliability of package via interconnection structures according to embodiments of the present invention. The large interfacial contact areas improve reliability by providing a large surface area for mechanical bonding between the via and the underlying conductive layer. Additionally, the large interfacial contact area improves performance by decreasing contact resistance between and the underlying conductive layer.

FIGS. 5, 6A, 7A–7D and 8A–8D are cross sectional views illustrating stages in the formation of improved via 240A/240B according to embodiments of the present invention depicted in FIGS. 4A and 4B. In particular, the views of FIGS. 7A–7D will yield the interconnection structure of FIG. 4A, while the views of FIGS. 8A–8D will yield the interconnection structure of FIG. 4B.

Figure 5:
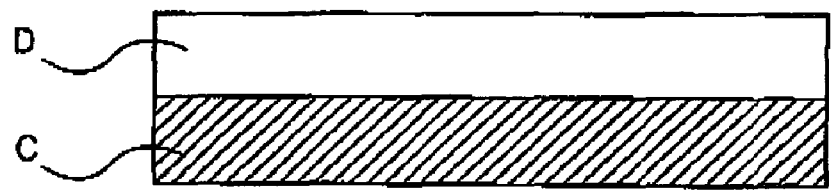
FIG. 5 is a cross sectional view of a combination adapted to be used as a starting point for making a package interconnection structure according to embodiments of the present invention.
Figure 6A:
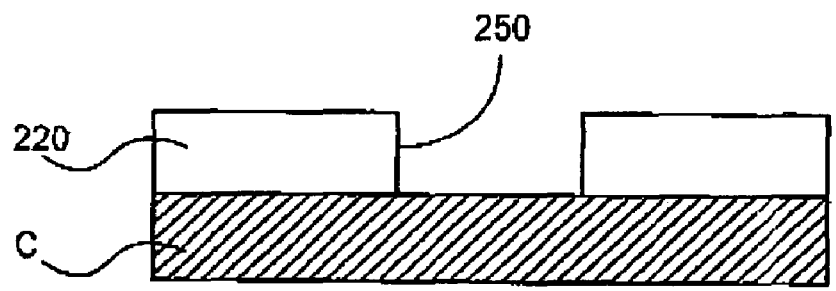
FIGS. 6A and 6B are cross sectional views depicting respective embodiments of a via hole formed in the dielectric layer of the combination of FIG. 5.

FIGS. 5 and 6A pertain to both embodiments, and depict a cross sectional view of a dielectric layer D provided on a conductive layer C as shown. The combination of FIG. 5, which is a possible starting point for the fabrication of embodiments of the interconnection structure of the present invention, may be part of a package arrangement such as, for example, the one shown in FIG. 1, where dielectric layer D may correspond to dielectric layer 130 of FIG. 1, and conductive layer C may correspond to conductive layer 120' in FIG. 1. As is well known, the dielectric layer D may be laminated onto conductive layer C, or provided on conductive layer C according to any one of known methods. In turn, the conductive layer C may be provided onto a package core, such as package core 110 of FIG. 1, made, for example, of fiber-reinforced board. Alternatively, conductive layer C may be provided above another via for the purpose of forming stacked vias. Conductive layer C may be made by first electrolessly plating copper on the core or on another via, and then using bulk electrolytic plating to add copper to the electrolessly plated copper seed layer.

Figure 6B:
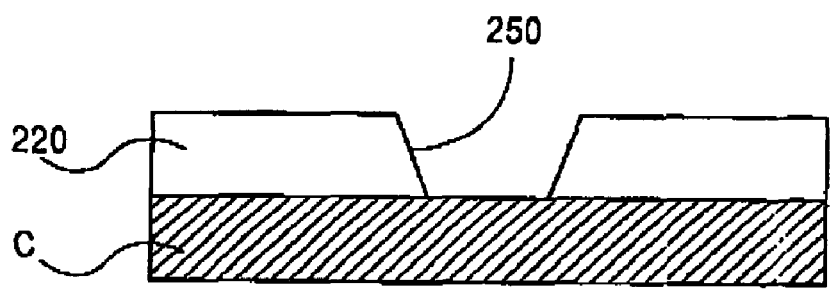

Referring next to FIGS. 6A and 6B, embodiments of the present invention include providing a via hole 250 through the dielectric layer D to achieve a patterned dielectric layer 220 as shown. The via may be laser etched into dielectric layer D according to known methods to extend through dielectric layer D to yield access to conductive layer C. The types of laser which may be used include, by way of example, CW CO2 or NdYAG lasers. The pulse width and application during of the laser would vary depending on the preferred via hole diameter, as would be within the knowledge of one skilled in the art. The hole 250 may have a cylindrical shape as shown in FIG. 6A, a conical shape as shown in FIG. 6B, or any other shape according to application needs. It is noted that, while, as noted above, the cross-sectional structure of FIG. 6A pertains to FIGS. 4A and 4B, the cross-sectional structure of FIG. 6B pertains to the embodiment of FIGS. 10 and 11A–11L, which will be described later in the instant description.

The stages of fabrication of the interconnection structure of FIGS. 4A and 4B will now be described with respect to FIGS. 7A–7D and 8A–8D, respectively.

Figure 7A:
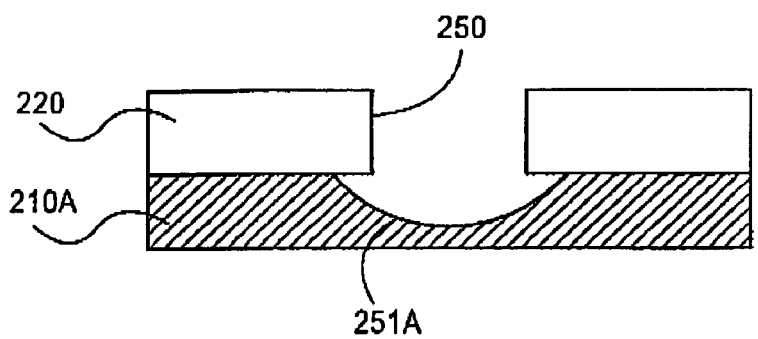
FIGS. 7A–7D are cross sectional views depicting stages in the formation of the package interconnection structure of FIG. 4A.
Figure 8A:
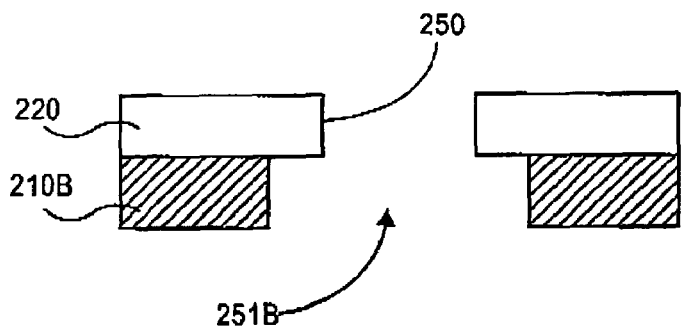
FIGS. 8A–8D are cross sectional views depicting stages in the formation of the package interconnection structure of FIG. 4B.

As seen in FIGS. 7A and 8A, according to embodiments of the present invention, after provision of a via hole, such as via hole 250, a recess is provided in conductive layer C to form recessed conductive layer 210 as shown. The recess may be an anchor shaped blind recess, as in recess 251A of FIG. 7A, or a straight recess 251B that extends through the conductive layer C as shown in FIG. 8A. It is understood that embodiments of the present invention include within their scope recesses having other shapes as long as the recess provides an interlocking volume beneath the dielectric layer. What is meant by "interlocking volume" is a volume, which, once filled with a material, provides an interlocking connection with the dielectric layer. The shape of recess 251A/251B creates undercut sections 270A/270B as shown, along with a recess portion within the conductive layer 210 that is concave for recess 251A, and straight for recess 251B. According to one embodiment, and preferably, the provision of recess 251A/251B may be made using an isotropic etch, for example an isotropic wet etch with sulfuric acid, such as, for example, with a sulfuric acid/hydrogen peroxide mixture, which would provide a good Cu-selective etch without etching the dielectric layer. The solution concentration and application duration would vary depending on the dimension of the via hole 250. Thus, larger via holes would require stronger concentrations and more application time when compared with smaller via holes. In addition to helping clean up any organic residue left by the laser etching of hole 250 from the bottom of the hole 250 and recess 251A/251B, an isotropic wet etch into the conductive layer C, such as into a copper pad, would help define the recess for the interlocking section 260A/260B including undercut section 270A/270B. If an isotropic wet etch is used to define recess 251A/251B, it may be used either in place of or in conjunction with a conventional roughening and desmear process what would clear organic residues from the bottom of hole 250 and recess 251A/251B. For example, a permanganate desmear may be used to further clean the via hole and recess. The desmearing would be performed after the isotropic etching, and is intended to roughen exposed dielectric surfaces and remove any smear using a solution such as, for example, permanganic acid to promote the deposition and adhesion of a conductive via or layer such as Cu.

Figure 7B:
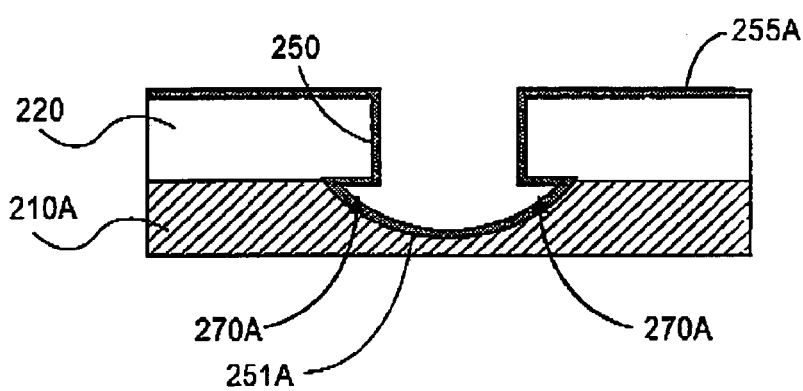
Figure 7C:
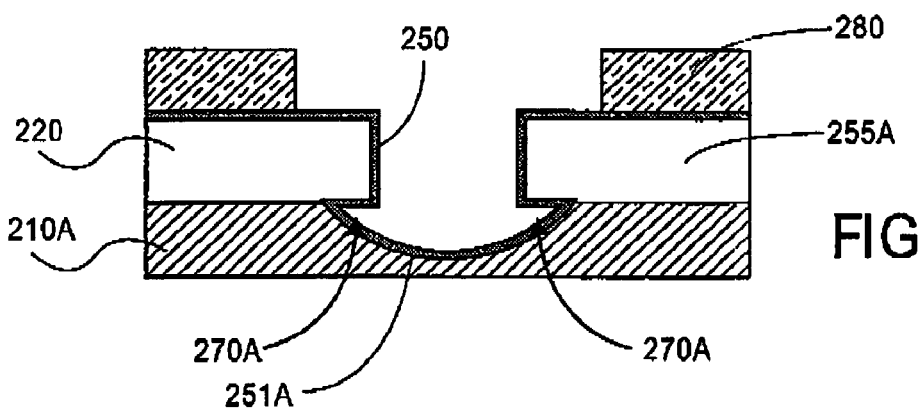
Figure 7D:
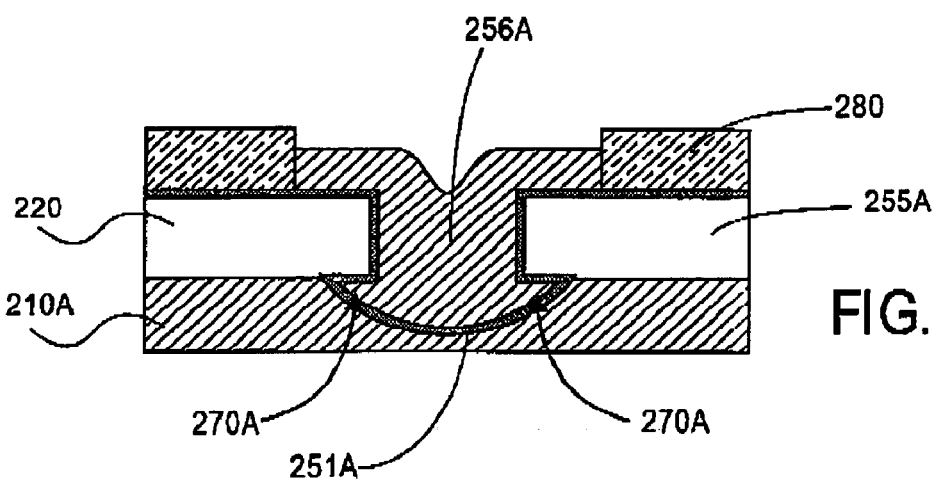
Figure 8B:
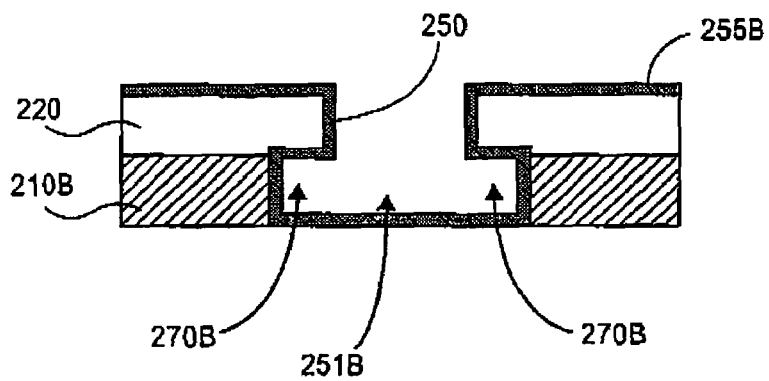
Figure 8C:
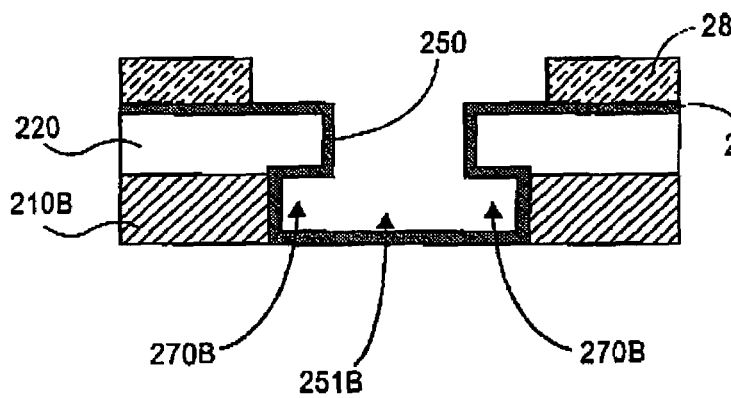

Referring next to FIGS. 7B–7D and 8B–8D, according to embodiments of the present invention, after provision of a via hole and recess, such as via hole 250 and recess 251A/251B, a conductive material is provided in the via hole and via recess in order to form the via. The provision of the conductive material preferably involves the provision of a conductive seed layer followed by the provision of a bulk conductive material on the seed layer. In the shown embodiments, provision of the conductive material in the via hole and via recess is concurrent with the provision of conductive material to form top conductive layer 210'. For example, the provision of the conductive material may involve first providing a seed layer of electrolessly plated copper in hole 250, in recess 251A/251B, and on the dielectric layer 220, and then providing bulk electrolytically plated copper on the seed layer in order to create the via and associated top conductive layer 210'. According to one embodiment, as shown in FIGS. 7B and 8B, the electrolessly plated layer 255A/255B, such as a copper layer, may cover patterned dielectric layer 210. In an embodiment, the seed layer may be about 0.5 micron to about 2 microns thick.

Figure 8D:
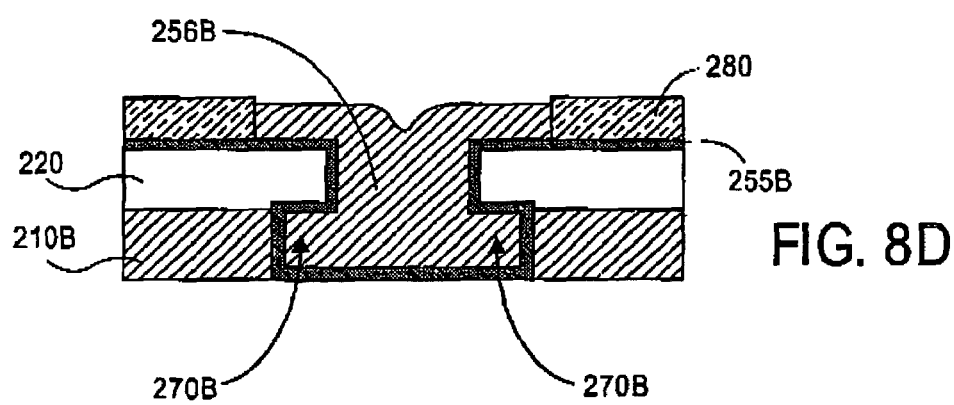

Referring next to FIGS. 7C–7D and 8C–8D, the provision of a bulk conductive material on the seed layer may involve first providing a patterned dry film layer on the seed layer, and thereafter plating the conductive material on exposed portions of the seed layer. As seen for example in FIGS. 7C and 8C, a patterned dry film layer 280 is shown as having been provided over a portion of seed layer 255A/255B. As shown, dry film layer 280 does not cover the portion of the seed layer onto which a conductive material is to be plated. In one embodiment, dry film layer 280 may be formed by applying a layer of dry film on the exposed surfaces, which will typically include the entire exposed surface of seed layer 255A/255B. A mask and light may be used to develop the applied dry film in a desired pattern that defines the dry film layer 280. Dry film stripping may then remove the unwanted applied dry film. The stripping process may remove dry film from the exposed portions of seed layer 255A/255B. Referring next to FIGS. 7D and 8D, a bulk conductive material 256A/256B, such as copper, is shown as having been provided on exposed portions of the seed layer as shown, such as through bulk electrolytic plating. As a result, hole 250 and recess 251A/251B are filled with the conductive material 256A/256B. Thereafter, the dry film layer 280 may be removed according to any one of well known methods, such as, for example, through a chemical stripping process. Removal of the dry film layer 280 will then expose portions of seed layer 255A/255B not covered with bulk conductive material 256A/256B, allowing a removal of the seed layer, such as through etching, for example, through wet etching, as would be readily recognizable by one skilled in the art. Removal of exposed portions of the seed layer will then result in the interconnection structures of FIGS. 4A and 4B as described above, via 240A/240B having thus been formed including an interlocking section 260A/260B.

Figure 9:
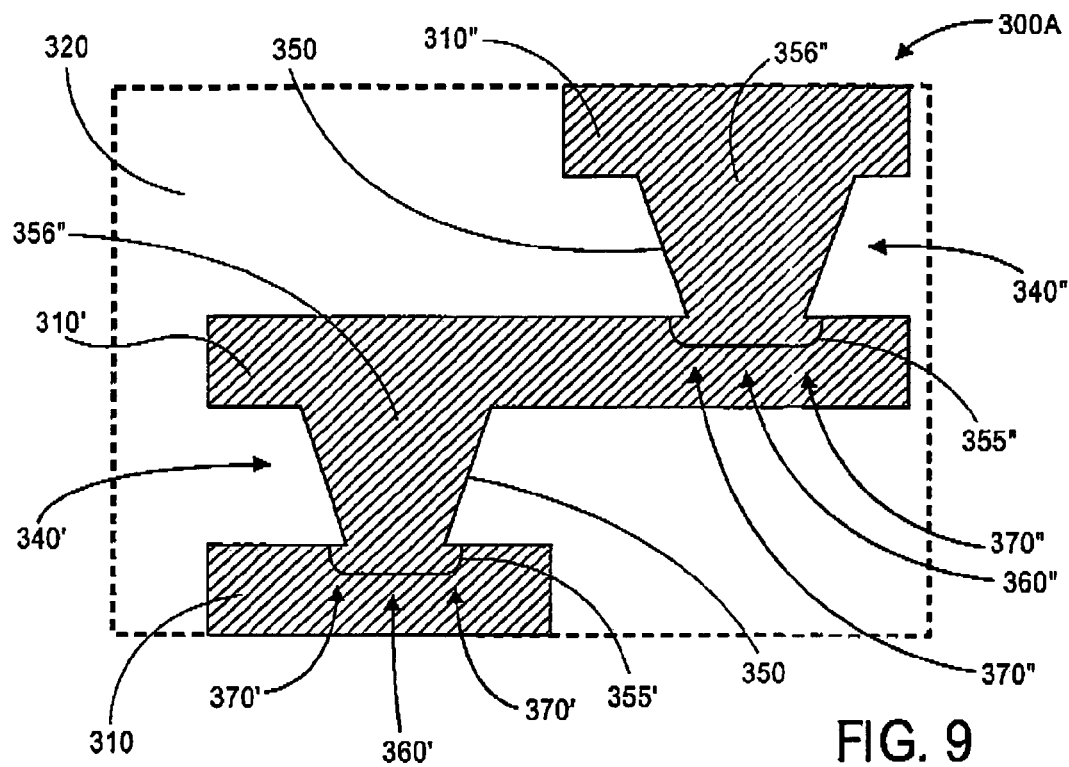
FIG. 9 is a cross sectional view of a staggered package interconnection structure according to an embodiment.
Figure 10:
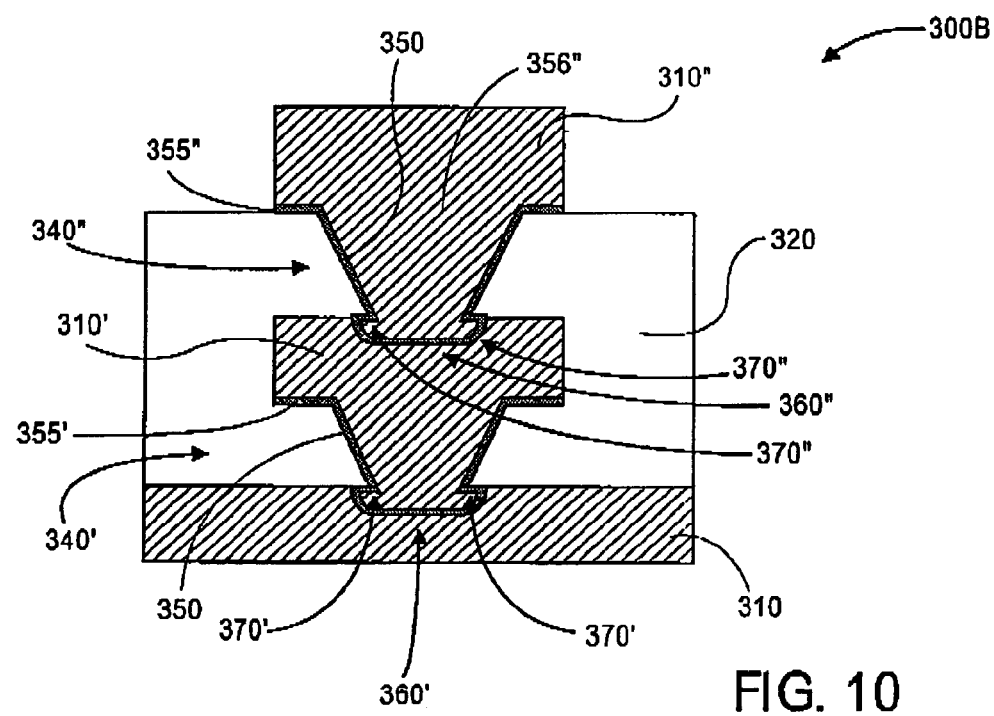
FIG. 10 is a cross sectional view of a stacked package interconnection structure according to an embodiment.

Referring next to FIGS. 9 and 10, embodiments of novel interconnection structures 300A and 300B are depicted according to embodiments of the present invention. While interconnection structure 300A presents a staggered via configuration of two vias connected in series and staggered with respect to one another, interconnection structure 300B presents a stacked via configuration of two vias connected in series and stacked directly above one another. The vias of structures 300A and 300B have a structure similar, for example, the via in the embodiment of FIG. 4A. Each of interconnection structures 300A and 300B include a first via 340' and a second via 340" including interlocking sections 360' and 360" as shown. Interlocking sections 360' and 360" are disposed within respective conductive layers 310 and 310', via 340" further providing an electrical interconnection at its top region with a conductive layer 310". Conductive layers 310, 310' and 310" may each be a conductive trace, a conductive plane, or another conductor, and may be made of copper. Dielectric material 320 embeds the vias and conductive layers, and may comprise a resin composite material, such as glass fibers in a hydrocarbon/ceramic matrix, glass fibers in a thermoset polyester matrix, a resin material, such as an epoxy, an epoxy-acrylate mixed resin, or other materials. Vias 340' and 340" may extend through the dielectric material 320 by way of a via hole 350. The conductive material providing in the holes and recesses of the vias may include a first electrolessly plated layer 355' and 355" and a bulk electrolytically plated layer 356' and 356" plated above layer 355' and 355", respectively, as shown. The conductive material may, in one embodiment, include copper. Interlocking section 360' and 360", with their respective overlap or undercut sections 370' and 370", act as a physical interlock.

Referring still to FIGS. 9 and 10, those figures therefore show an interconnection structure 300A/300B of a microelectronic package which includes a first conductive layer 310, a second conductive layer 310' disposed at a distance with respect to the first conductive layer 310, and a third conductive layer 310" disposed at a distance with respect to the second conductive layer 310'. The structure 300A/300B further includes a dielectric material 320 comprising a first dielectric material portion that is disposed between the first conductive layer 310 and the second conductive layer 310' as shown in FIGS. 9 and 10, and a second dielectric material portion disposed between the second conductive layer 310' and the third conductive layer 310 " as also shown in FIGS. 9 and 10. In the shown embodiment, as noted in the paragraph above, dielectric material 320 embeds the conductive layers. The structure 300A/300B also includes a pair of package vias 340" and 340". The pair of package vias includes a first package via 340" comprising a first conductive material extending from the second conductive layer 310' through the first dielectric material portion of the dielectric material 320 to the first conductive layer 310, the first package via 340" defining a first interlocking section 360' extending into the first conductive layer 310 and under the first dielectric material portion. The pair of package vias also includes a second package via 340" comprising a second conductive material extending from the third conductive layer 310 " through the second dielectric material portion of the dielectric material 320 to the second conductive layer 310', the second package via defining a second interlocking section 360' extending into the second conductive layer 310' and under the second dielectric material portion.

The stages of fabrication of the interconnection structure 300B of FIG. 10 will now be described with respect to FIGS. 11A–11L.

The fabrication stages of FIGS. 11A–11D correspond to the fabrication stages already described above with respect to FIGS. 7A–7D. In addition, a starting point for stages 11A–11L is the combination shown in FIG. 6B, which includes a bottom conductive layer C and a top dielectric layer D, where a conically shaped hole is provided, for example via laser etching, in the dielectric layer D to yield a patterned dielectric layer 315.

Figure 11A:
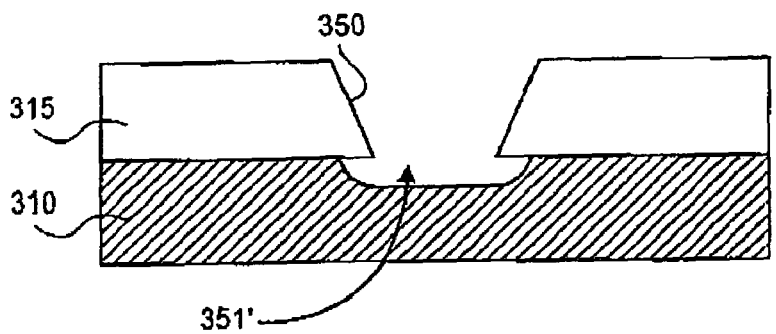
Figure 11B:
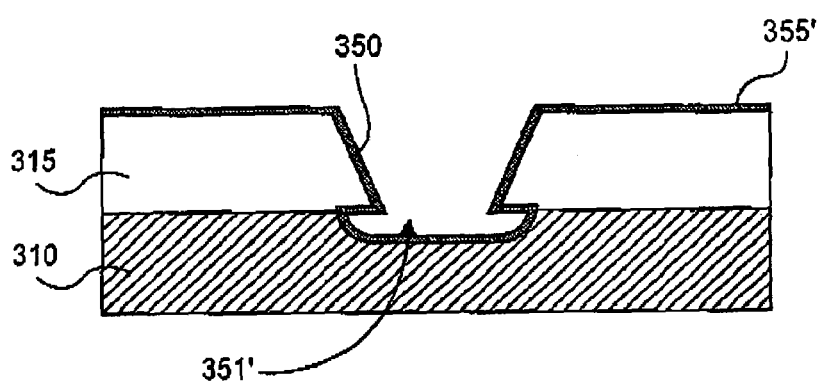
Figure 11C:
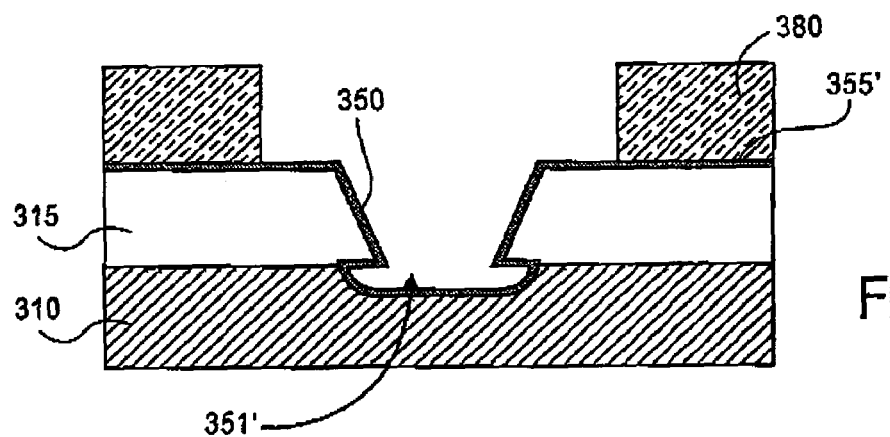
Figure 11D:
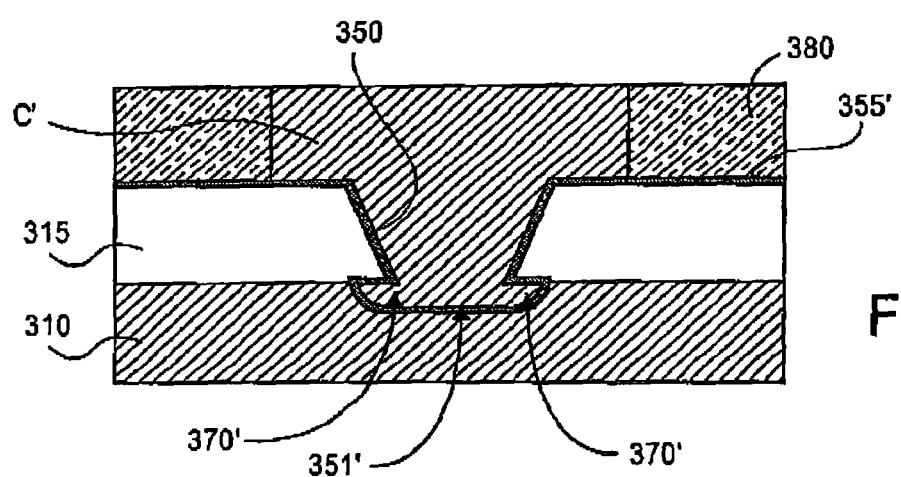

After provision of hole 350, according to embodiments of the present invention, as seen in FIG. 11A, a recess 351' is provided in conductive layer C to form recessed conductive layer 310 as shown, which may be an anchor-shaped recess formed in the same manner as described for example with respect to FIG. 7A. Next, as seen in FIGS. 11B–11D, and similar to the respective stages of FIGS. 7B–7D, according to embodiments of the present invention, a conductive material is provided in the via hole and via recess in order to form the via. The provision of the conductive material preferably involves the provision of a conductive seed layer followed by the provision of a bulk conductive material on the seed layer. For example, the provision of the conductive material may involve first providing a seed layer 355' of electrolessly plated copper in hole 350 and recess 351', and then providing a bulk conductive material 356', such as bulk electrolytically plated copper, on the seed layer in order to create the via. Provision of seed layer 355' and of bulk conductive material 356' may be effected in the same manner as described with respect to FIGS. 7B–7D. For example, according to one embodiment, as shown in FIG. 11B, the electrolessly plated layer 355', such as a copper layer, may cover patterned dielectric layer 315. In an embodiment, the seed layer may be about 0.5 micron to about 2 microns thick.

Referring next to FIGS. 11C–11D, the provision of a bulk conductive material on the seed layer may involve first providing a patterned dry film layer on the seed layer, and thereafter plating the conductive material on exposed portions of the seed layer. As seen for example in FIG. 11C, a patterned dry film layer 380 is shown as having been provided over a portion of seed layer 355', similar to dry film layer 380 of FIG. 7C. Thereafter, referring to FIG. 11D, a bulk conductive material 356', such as copper, is shown as having been provided on exposed portions of the seed layer as shown, such as through bulk electrolytic plating. As a result, hole 350 and recess 351' are filled with the conductive material 356' and a second conductive layer C' further provided. Thereafter, the dry film layer 380 may be removed according to any one of well known methods, such as, for example, through a chemical stripping process. Removal of the dry film layer 380 will then expose portions of seed layer 355'.

Figure 11E:
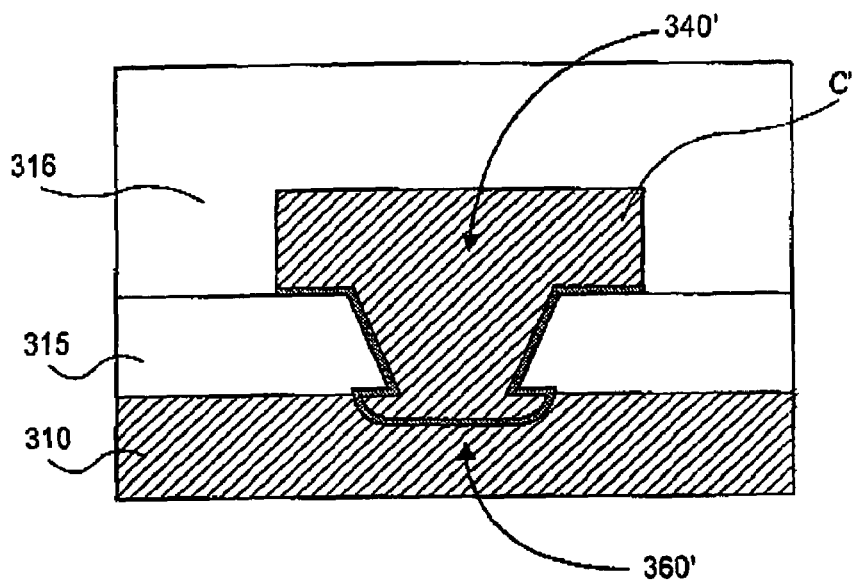
Figure 11F:
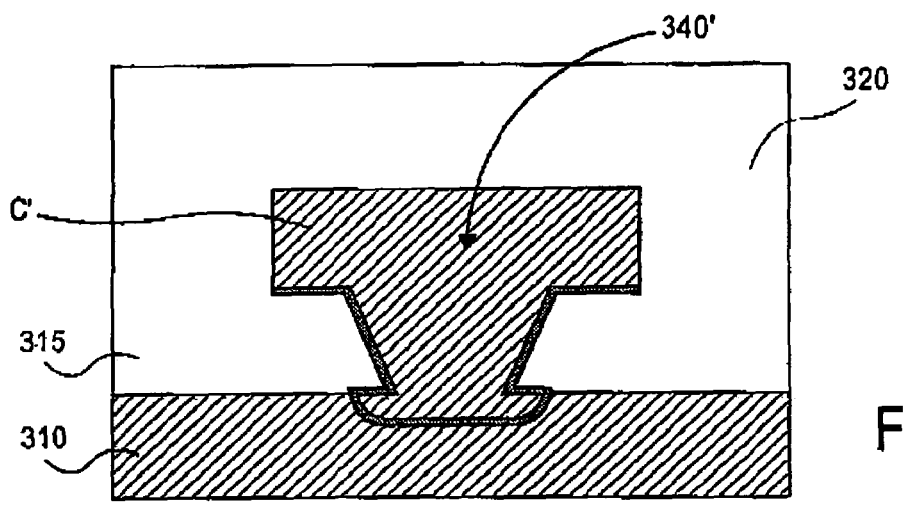

Referring next to FIG. 11E, forming the interconnection structure of FIG. 10 further involves laminating a second dielectric layer 316 above dielectric layer 315. Lamination may be effected according to any one of methods known in the art. Thereafter, as seen in FIG. 11F, the dielectric layers 315 and 316 are cured to yield a single dielectric material 320 embedding via 340' as shown. For example, according to one embodiment, layers 315 and 316 may be sheet film rolls that are each press rolled into position, and then subjected to curing, for example through the application of heat, to achieve a dielectric gel which conforms and completely adheres to the underlying layer. Thereafter, the gel is dried for the dielectric to again solidify, as would be recognized by one skilled in the art.

Figure 11G:
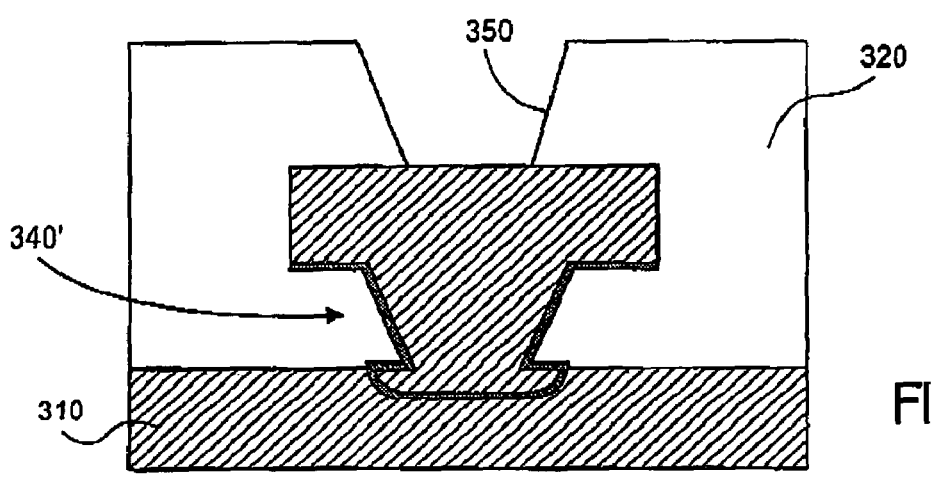
Figure 11H:
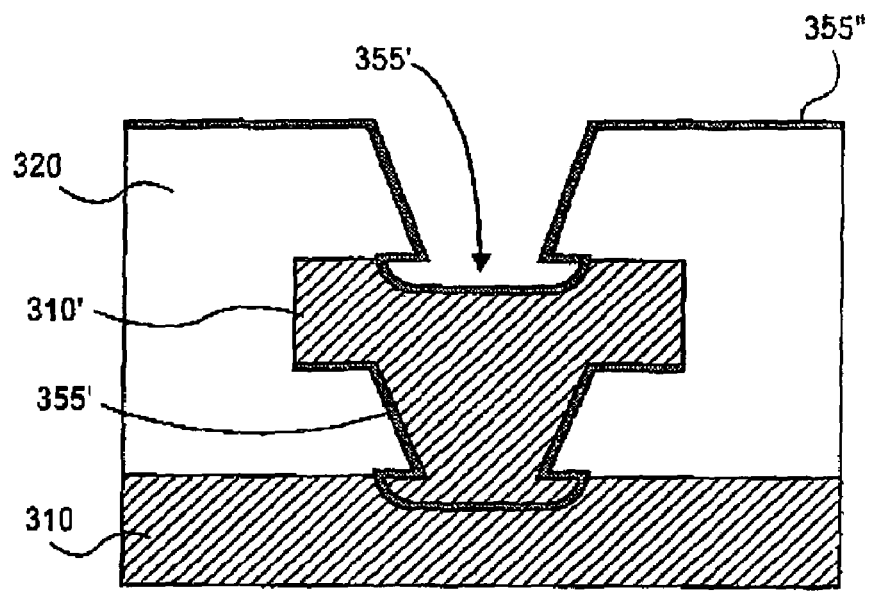
Figure 11I:
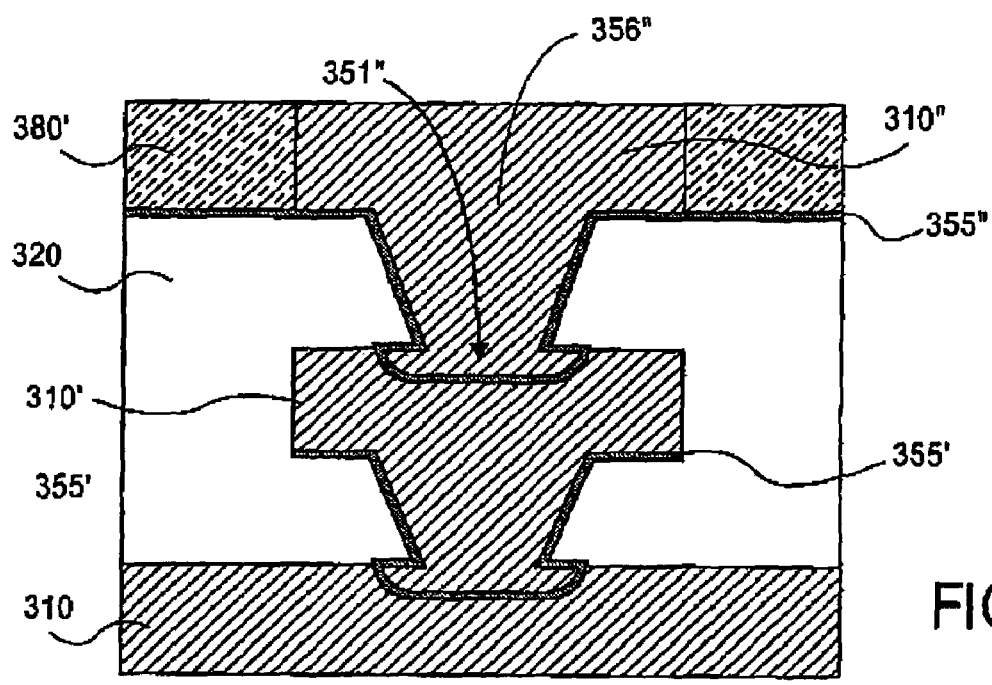

The subsequent stages depicted in FIGS. 11G–11L are similar to stages 6B and 11A–11D. Thus, as seen in FIG. 11G, similar to FIG. 6B, a hole 350 is provided in dielectric material 320 to extend therethrough up to conductive layer C'. After provision of hole 350, according to embodiments of the present invention, as seen in FIG. 11H, a recess 351" is provided in conductive layer C' to form recessed conductive layer 310' as shown, which may be an anchor-shaped recess formed in the same manner as described for example with respect to FIG. 11A. Next, similar to the respective stages of FIGS. 11B–11D, according to embodiments of the present invention, as shown in FIGS. 11H and 11L, a conductive material is provided in the via hole and via recess in order to form the via. The provision of the conductive material preferably involves the provision of a conductive seed layer followed by the provision of a bulk conductive material on the seed layer. For example, the provision of the conductive material may involve first providing a seed layer 355" of electrolessly plated copper in hole 350 and recess 351", and then providing a bulk conductive material 356", such as bulk electrolytically plated copper, on the seed layer in order to create the via. Provision of seed layer 355" and of bulk conductive material 356" may be effected in the same manner as described with respect to FIGS. 11B–11D. For example, according to one embodiment, as shown in FIG. 11B, the electrolessly plated layer 355", such as a copper layer, may cover dielectric material 320. In an embodiment, the seed layer may be about 0.5 to about 2 microns thick.

Referring in particular to FIG. 11L, the provision of a bulk conductive material on the seed layer may involve first providing a patterned dry film layer on the seed layer, and thereafter plating the conductive material on exposed portions of the seed layer. As seen for example in FIG. 11L, a patterned dry film layer 380' is shown as having been provided over a portion of seed layer 355", similar to dry film layer 380 of FIG. 11C. Thereafter, a bulk conductive material 356", such as copper, is shown as having been provided on exposed portions of the seed layer as shown, such as through bulk electrolytic plating. As a result, hole 350 and recess 351" are filled with the conductive material 356". Thereafter, the dry film layer 380' may be removed according to any one of well known methods, such as, for example, through a chemical stripping process. Removal of the dry film layer 380' will then expose portions of seed layer 355" not covered with bulk conductive material 356", allowing a removal of the seed layer, such as through etching, for example, through wet etching, as would be readily recognizable by one skilled in the art, to yield the configuration of FIG. 10.

As would be recognized by one skilled in the art, it is noted the stages of fabrication described with respect to FIGS. 11A–11L could be used in a modified form to yield the interconnection structure of FIG. 9 with its staggered vias according to embodiments of the present invention.

Advantageously, embodiments of the present invention allow an increase in the surface contact area between a package via and its corresponding conductive layer, providing an interlocking section that secures and holds the via under a dielectric layer, thus providing mechanical support against stress and subsequent via delamination. As would be recognized by one skilled in the art, embodiments of the present invention advantageously have minimal impact on current substrate manufacturing processes, requiring only the addition of an etching process to generate recesses for the interlocking sections of the vias, and otherwise allowing the use of existing processes. Thus, embodiments of the present invention advantageously provide a simple and cost-effective method for fabricating package vias that further does not compromise high-throughput. In addition, embodiments of the present invention present a viable solution for future technologies, advantageously allowing further interconnections with smaller footprints, and higher numbers of stacked vias.

Figure 12:
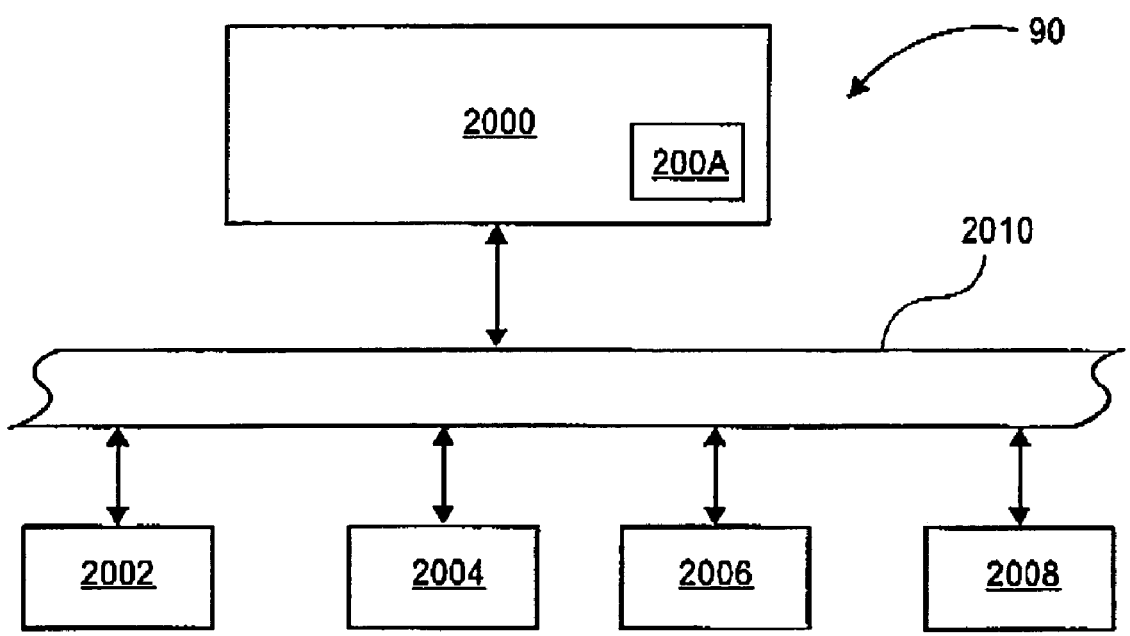
FIG. 12 is a system incorporating a package interconnection structure according to an embodiment of the present invention.

Referring to FIG. 12, there is illustrated one of many possible systems 90 in which embodiments of the present invention may be used. The electronic assembly 2000 incorporating a package including interlocking vias according to embodiments of the present invention, such as a package incorporating interconnection structure 200A of FIG. 4A, may include a microprocessor. In an alternate embodiment, the electronic assembly 2000 may include an application specific IC (ASIC). Integrated circuits found in chipsets (e.g., graphics, sound, and control chipsets) may also be packaged in accordance with embodiments of this invention.

For the embodiment depicted by FIG. 12, the system 90 may also include a main memory 2002, a graphics processor 2004, a mass storage device 2006, and/or an input/output module 2008 coupled to each other by way of a bus 2010, as shown. Examples of the memory 2002 include but are not limited to static random access memory (SRAM) and dynamic random access memory (DRAM). Examples of the mass storage device 2006 include but are not limited to a hard disk drive, a compact disk drive (CD), a digital versatile disk drive (DVD), and so forth. Examples of the input/output module 2008 include but are not limited to a keyboard, cursor control arrangements, a display, a network interface, and so forth. Examples of the bus 2010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

Although specific embodiments have been illustrated and described herein for purposes of description of the preferred embodiment, it will be appreciated by those of ordinary skill in the art that a wide variety of alternate and/or equivalent implementations calculated to achieve the same purposes may be substituted for the specific embodiment shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An interconnection structure of a microelectronic package comprising:
    a first conductive layer;
    a second conductive layer disposed at a distance with respect to the first conductive layer;
    a third conductive layer disposed at a distance with respect to the second conductive layer;
    a dielectric material comprising;
        a first dielectric material portion disposed between the first conductive layer and the second conductive layer;
        a second dielectric material portion disposed between the second conductive layer and the third conductive layer; and
    a pair of package vias comprising:
        a first package via comprising a first conductive material extending through a first via hole through the first dielectric material portion from the second conductive layer to the first conductive layer, the first package via defining a first interlocking section wider than the first via hole and extending into the first conductive layer and under the first dielectric material portion; and
        a second package via comprising a second conductive material extending through a second via hole through the second dielectric material portion from the third conductive layer to the second conductive layer, the second package via defining a second interlocking section wider than the second via hole and extending into the second conductive layer and under the second dielectric material portion.

2. The interconnection structure of claim 1, wherein at least one of the first package via and the second package via comprises copper.

3. The interconnection structure of claim 1, wherein at least one of the first interlocking section and the second interlocking section is one of anchor-shaped end T shaped.

4. The interconnection structure of claim 1, wherein at least one of the first interlocking package via and the second package via is one of a blind via and a through via.

5. The interconnection structure of claim 1, wherein at least one of the first conductive material and the second conductive material comprises;
    a conductive seed layer adjacent a corresponding one of the first dielectric material portion and the second dielectric portion and adjacent a corresponding one of the first conductive layer and the second conductive layer, and
    a bulk conductive material on the seed layer to form an associated one of the first package via and the second package via.

6. The interconnection structure of claim 1, wherein the first package via and the second package via are one of stacked and staggered with respect to one another.

7. The interconnection structure of claim 1, wherein the first and second package vias comprise copper.

8. A system comprising:
    an electronic assembly including a microelectronic package, the package having an interconnection structure therein comprising:
        a first conductive layer;
        a second conductive layer disposed at a distance with respect to the first conductive layer;
        a third conductive layer disposed at a distance with respect to the second conductive layer;
        a dielectric material comprising;
            a first dielectric material portion disposed between the first conductive layer and the second conductive layer;
            a second dielectric material portion disposed between the second conductive layer and the third conductive layer and a pair of package vias comprising;
            a first package via comprising a first conductive material extending from the second conductive layer through the first dielectric material portion to the first conductive layer, the first package via defining a first interlocking section extending into the first conductive layer and under the first dielectric material portion; and
            a second package via comprising a second conductive material extending from the third conductive layer through the second dielectric material portion to the second conductive layer, the second package defining a second interlocking section extending into the second conductive layer and under the second dielectric material portion; and
        a first package via comprising a first conductive material extending through a first via hole through the first dielectric material portion from the second conductive layer to the first conductive layer, the first package via defining a first interlocking section wider than the first via hole and extending into the first conductive layer and under the first dielectric material portion; and
        a second package via comprising a second conductive material extending through a second via hole through the second dielectric material portion from the third conductive layer to the second conductive layer, the second package via defining a second interlocking section wider than the second via hole and extending into the second conductive layer and under the second dielectric material portion;
    a graphics processor coupled to the electronic assembly.

9. The system of claim 8, wherein at least one of the first package via and the second package via comprises copper.

10. The system of claim 8, wherein at least one of the first conductive material and the second conductive material comprises:
    a conductive seed layer adjacent a corresponding one of the first dielectric material portion and the second dielectric portion and adjacent a corresponding one of the first conductive layer and the second conductive layer, and
    a bulk conductive material on the seed layer to form an associated one of the first package via end the second package via.

11. The system of claim 8, wherein the first package via and the second package via are one of stacked and staggered with respect to one another.

* * * * *